(12) United States Patent
Tokudome

(10) Patent No.: US 7,659,132 B2
(45) Date of Patent: Feb. 9, 2010

(54) SEMICONDUCTOR ELEMENT HOLDING APPARATUS AND SEMICONDUCTOR DEVICE MANUFACTURED USING THE SAME

(75) Inventor: Hiroyuki Tokudome, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 305 days.

(21) Appl. No.: 11/717,682

(22) Filed: Mar. 14, 2007

(65) Prior Publication Data

US 2007/0205548 A1 Sep. 6, 2007

Related U.S. Application Data

(62) Division of application No. 11/178,467, filed on Jul. 12, 2005, now Pat. No. 7,207,554.

(30) Foreign Application Priority Data

Sep. 3, 2004 (JP) ............................. 2004-256391

(51) Int. Cl.
*H01L 21/00* (2006.01)
(52) U.S. Cl. ...................... 438/50; 438/460; 438/464; 257/E29.324
(58) Field of Classification Search ............. 438/460, 438/464, 50
See application file for complete search history.

(56) References Cited

U.S. PATENT DOCUMENTS

| 5,374,829 | A | 12/1994 | Sakamoto et al. |
| 5,660,380 | A | 8/1997 | Reis et al. |
| 6,036,196 | A | 3/2000 | Freund et al. |
| 6,423,102 | B1 | 7/2002 | Fukunaga et al. |
| 2002/0026931 | A1* | 3/2002 | Kurosawa et al. ............ 125/35 |
| 2004/0187575 | A1* | 9/2004 | Murata et al. ............ 73/514.16 |
| 2006/0049564 | A1 | 3/2006 | Tokudome |

FOREIGN PATENT DOCUMENTS

| JP | 05-243375 | 9/1993 |
| JP | 05-326673 | 12/1993 |
| JP | 07-066268 A | 3/1995 |
| JP | 11-087374 A | 3/1999 |
| JP | 11-163005 A | 6/1999 |
| JP | 2001-242432 A | 9/2001 |

* cited by examiner

*Primary Examiner*—Alexander G Ghyka
(74) *Attorney, Agent, or Firm*—Rabin & Berdo, P.C.

(57) ABSTRACT

A semiconductor element holding apparatus includes a collet for suctioning a semiconductor element by negative pressure to hold the semiconductor element. The collet has a protrusion formed at the semiconductor element-holding surface thereof, and the protrusion is provided with a plurality of suction holes. The suction holes are opened to the semiconductor element-holding surface. The surface of the semiconductor element is held by the semiconductor element-holding surface of the protrusion of the collet.

18 Claims, 7 Drawing Sheets

SEMICONDUCTOR ELEMENT HOLDING APPARATUS AND SEMICONDUCTOR DEVICE MANUFACTURED USING THE SAME

This is a Divisional of U.S. application Ser. No. 11/178,467, filed Jul. 12, 2005, and issued as U.S. Pat. No. 7,207,554 on Apr. 24, 2007, the subject matter of which is incorporated herein by reference.

BACKGROUND OF THE INVENTION

1. Field of the Invention

The present invention relates to a semiconductor element holding apparatus that is capable of holding and conveying one or more semiconductor elements separated from a wafer to a desired place, and also relates to a semiconductor device manufactured using the same.

2. Description of the Related Art

A conventional semiconductor element holding apparatus fixes a wafer having a plurality of semiconductor elements formed thereon to a sheet on which an adhesive agent is applied. Then, the wafer is divided into pieces (i.e., a plurality of semiconductor elements) by a cutter. The semiconductor element holding apparatus raises one of the divided semiconductor elements by means of lifting needles, and suctions the raised semiconductor element to the inclined surface of a collet having an inclined suctioning part by negative pressure. In this way, the conventional semiconductor element holding apparatus holds the semiconductor element. This is for example, disclosed in a Japanese Patent Kokai (Laid-open Application) No. 5-326673.

When the semiconductor element has an area whose surface can not be brought into direct contact with the collet of the semiconductor element holding apparatus (e.g., when the semiconductor element is a charge coupled device (CCD)), surface contact areas are formed on both ends in the lengthwise direction of the semiconductor element, and the surface contact areas are brought into contact with a collet having vacuum suction holes so that the semiconductor element is suctioned, and held, by the negative pressure applied from the vacuum suction holes of the collet. This is for example disclosed in a Japanese Patent Kokai (Laid-open Application) No. 5-243375.

Generally, a wafer having a plurality of semiconductor elements formed thereon is divided into pieces by a cutter, such as a diamond blade. When the wafer is cut by the cutter, the cut surface of each divided semiconductor element is partially collapsed due to minute scratches and cracks created when cutting the wafer. As a result, a fragile layer of 5 to 10 µm (hereinafter, referred to as an "element collapse layer") is formed.

According to Japanese Patent Kokai No. 5-326673, the semiconductor element divided from the wafer is suctioned to the inclined surface of the collet. When the inclined surface of the collet is brought into contact with the edge of the cut surface of the semiconductor element, the element collapse layer is collapsed. As a result, pieces of the collapsed element collapse layer (hereinafter, referred to as "element collapse pieces") drop onto other semiconductor elements when the semiconductor element is suctioned by the collet or the semiconductor element is released after conveying the semiconductor to a remote place. Consequently, the cleanness of the semiconductor element is deteriorated.

In a semiconductor element having flexible parts that are thin to have flexibility, such as a semiconductor element used in a semiconductor acceleration sensor, the flexible parts are deformed and thus damaged when the inclined surface of the collet is brought into contact with the edge of the semiconductor element to suction the entire surface of the semiconductor element by negative pressure.

SUMMARY OF THE INVENTION

One object of the present invention is to provide an arrangement for preventing creation of element collapse pieces in a semiconductor element having an element collapse layer formed thereon.

Another object of the present invention is to provide an arrangement for preventing damage to flexible parts in a semiconductor element having the flexible parts.

According to one aspect of the present invention, there is provided an improved semiconductor element holding apparatus. This semiconductor element holding apparatus includes a collet for suctioning a semiconductor element by negative pressure to hold the semiconductor element. The collet has a protrusion formed at the semiconductor element-holding surface thereof, and the protrusion is provided with a plurality of suction holes. The suction holes are directed to the semiconductor element which is to held on the semiconductor-element holding surface. The suction holes define, in effect, the semiconductor holding surface of the collet.

The semiconductor element-holding surface of the protrusion of the collet is brought into contact with the surface of the semiconductor element to hold the semiconductor element, and the collet does not come into contact with the element collapse layer formed at the cut surface of the semiconductor element. Consequently, the element collapse pieces are prevented from being created.

If the semiconductor element has flexible parts, the semiconductor element is suctioned, and held, by the suction holes of the protrusion of the collet while the flexible parts of the semiconductor element are protected by the semiconductor element-holding surface of the protrusion. Consequently, the flexible parts of the semiconductor element are prevented from being damaged.

BRIEF DESCRIPTION OF THE DRAWINGS

The above and other objects, features, aspects and advantages of the present invention will be more clearly understood from the following detailed description and appended claims when taken in conjunction with the accompanying drawings, in which:

DETAILED DESCRIPTION OF THE INVENTION

Now, semiconductor element holding apparatuses according to embodiments of the present invention will be described in detail with reference to the accompanying drawings.

Embodiment 1

Figure 1:
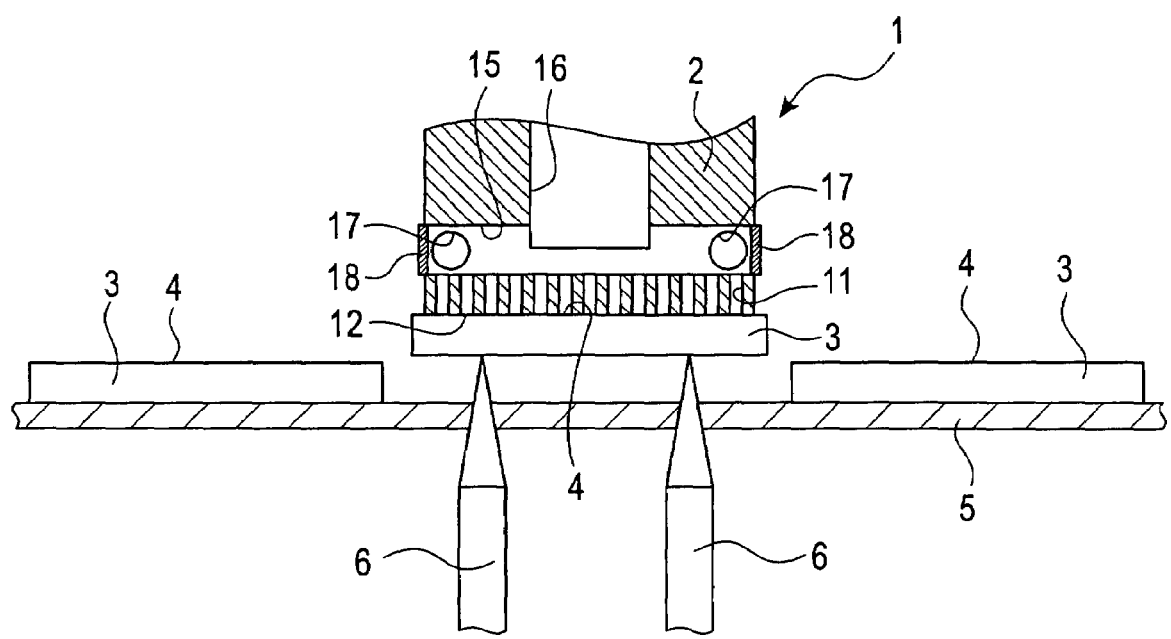
FIG. 1 shows a semiconductor element holding apparatus according to a first embodiment of the present invention.

Referring to FIG. 1, a semiconductor element holding apparatus according to a first embodiment of the present invention will be described.

The semiconductor element holding apparatus, which is indicated by reference numeral 1, includes a collet 2, a suction pump (not shown), a collet lifting mechanism and a collet X-Y moving mechanism. These mechanisms lift and move the collet 2 in X and Y directions.

The collet 2 has a surface facing a semiconductor element 3, which is held by the collet 2. The semiconductor element-facing surface of the collet 2 is formed in the shape similar to a surface 4 of the semiconductor element 3. In the illustrated embodiment, the semiconductor element-facing surface of the collet 2 is approximately formed in the shape of a rectangle, as shown in FIG. 2.

The semiconductor element 3 is divided from a wafer. The wafer is made of silicon and has a plurality of semiconductor elements 3, such as large-scale integrated semiconductor elements. The lower surface of the wafer is fixed to a fixing sheet 5, on which an adhesive agent is applied. The fixing sheet 5 has elasticity. The wafer is cut lengthwise and breadthwise by a cutter, such as a diamond blade, into pieces.

Reference numeral 6 indicates lifting needles, which are vertically movable to raise the divided semiconductor element 3 from the fixing sheet 5 to the collet 2.

Figure 2:
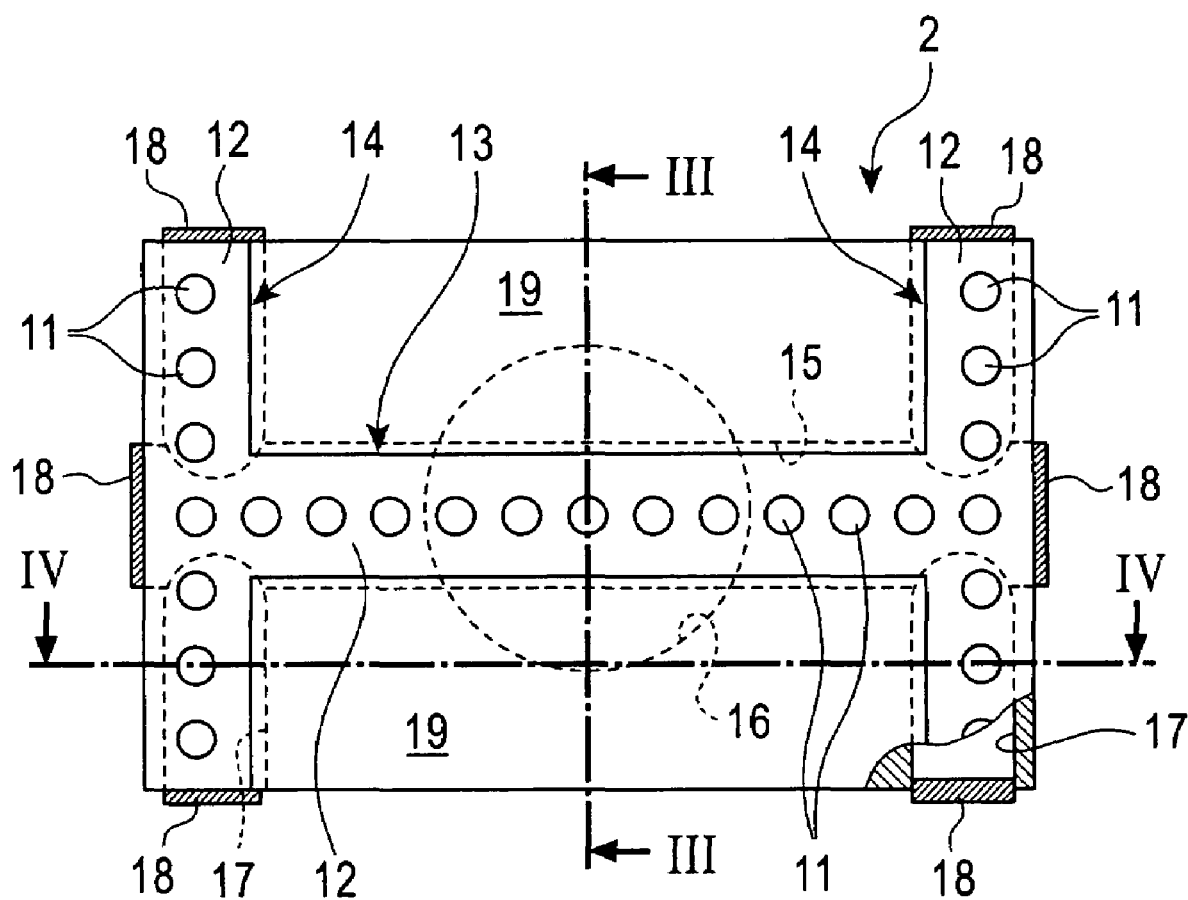
FIG. 2 is a bottom view of a collet of the semiconductor element holding apparatus shown in FIG. 1.

Referring to FIG. 2, reference numeral 11 indicates a plurality of suction holes. The suction holes 11 are formed in a narrow protrusion, which is disposed at the semiconductor element-facing surface of the collet 2, i.e., the semiconductor element-holding surface of the collet 2. The suction holes 11 are opened to a semiconductor element-facing surface 12 of the protrusion (hereinafter, referred to as a "semiconductor element-holding surface").

In the illustrated embodiment, the protrusion includes a middle protrusion part 13 disposed along the middle line of the semiconductor element 3. The protrusion also includes two edge protrusion parts 14 disposed along the breadthwise edges of the semiconductor element 3. The center portions of the edge protrusion parts 14 are connected to both ends of the middle protrusion part 13, respectively. The edge protrusion parts 14 are at right angles to the middle protrusion part 13. Consequently, the protrusion is approximately formed in the shape of an "H."

The semiconductor element-holding surface 12 of the protrusion is processed by a mirror finishing process or coated with polytetrafluoroethylene.

Figure 3:
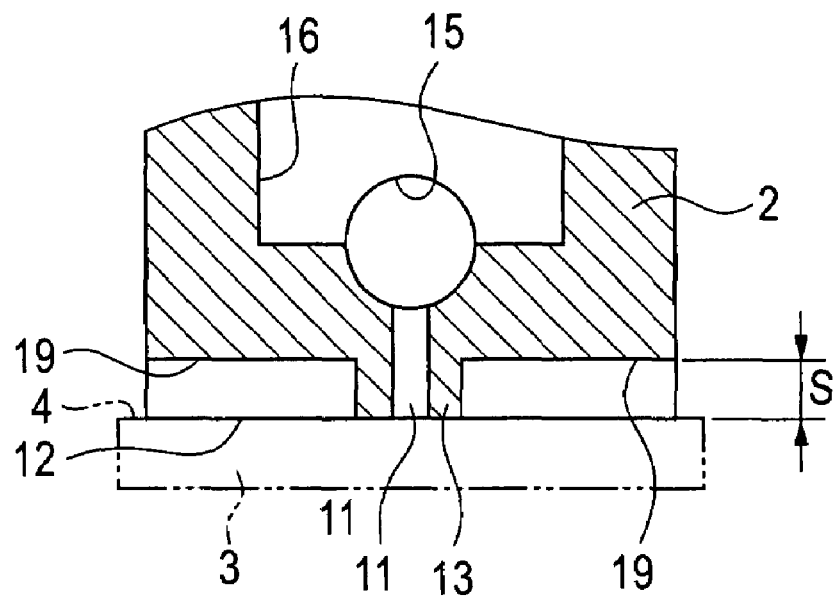
FIG. 3 illustrates a cross-sectional view taken along line III-III of FIG. 2.

Referring to FIGS. 1 and 3, reference numeral 15 indicates a middle negative pressure channel 15, which extends through the collet 2 along the middle of the collet 2. The middle negative pressure channel 15 is disposed above the middle protrusion part 13. The middle negative pressure channel 15 communicates with a negative pressure supply hole 16, which is connected to the suction pump for supplying negative pressure to the collet 2. Also, the middle negative pressure channel 15 communicates with the suction holes 11 opened to the semiconductor element-holding surface 12 of the middle protrusion part 13.

Figure 4:
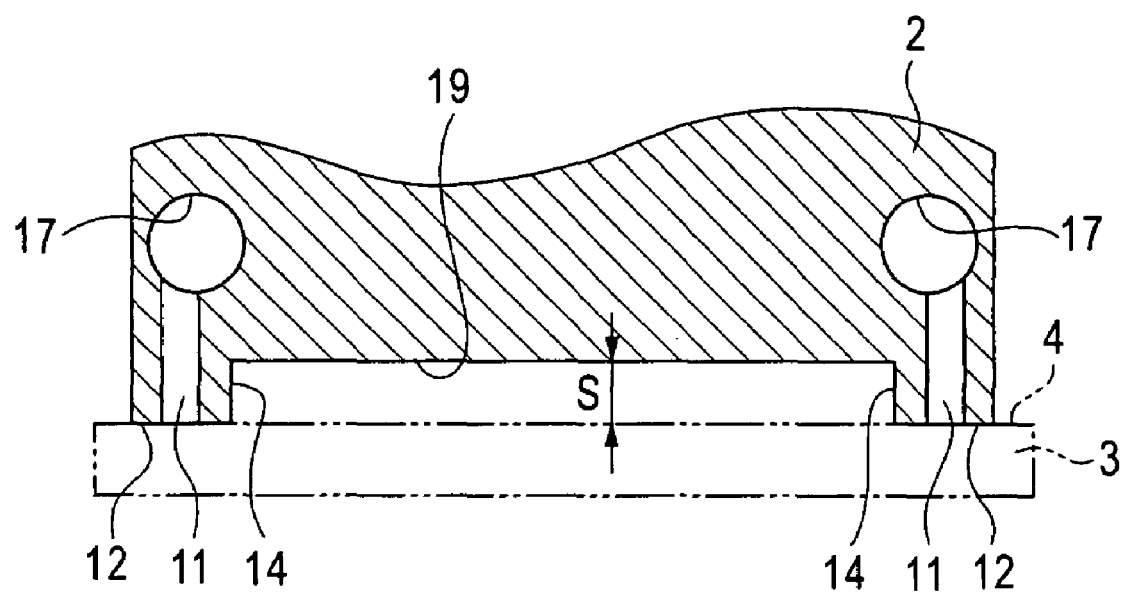
FIG. 4 illustrates a cross-sectional view taken along line IV-IV of FIG. 2.

Referring to FIG. 1 and FIG. 4, reference numeral 17 denotes edge negative pressure channels, which extend through the collet 2 along both edges of the collet 2. The edge negative pressure channels 17 are disposed above the edge protrusion parts 14, respectively. The center portions of the edge negative pressure channels 17 communicate with the middle negative pressure channel 15. The edge negative pressure channels 17 also communicate with the suction holes 11 opened to the semiconductor element-holding surface 12 of the corresponding edge protrusion parts 14.

Referring back to FIG. 1 and FIG. 2, reference numeral 18 denotes caps, which are forcibly fitted in both ends of the middle negative pressure channel 15 and both ends of the respective edge negative pressure channels 17, respectively, for preventing air from leaking into the negative pressure of the middle negative pressure channel 15 and the edge negative pressure channels 17. The lower right part of FIG. 2 particularly shows the cap.

Consequently, the negative pressure supplied into the negative pressure supply hole 16 is introduced into the respective suction holes 11 through the middle negative pressure channel 15 and the edge negative pressure channels 17. As a result, when the semiconductor element-holding surface 12 of the middle protrusion part 13 and the edge protrusion parts 14 come into contact with the surface 4 of the semiconductor element 3, the semiconductor element 3 is held by suction to the semiconductor element-holding surface 12. In this way, the semiconductor element 3 is held by the semiconductor element holding apparatus 1.

The height of the protrusion is set to a predetermined size S, which is indicated in FIGS. 3 and 4. Consequently, when the semiconductor element-holding surface 12 of the protrusion comes into contact with the surface 4 of the semiconductor element 3, a gap, which corresponds to the size S, is formed between the surface 4 of the semiconductor element 3 and the lower surface 19 of a main body of the collet 2.

In the illustrated embodiment, the size S is set to 0.05-0.3 mm, the diameter of the negative pressure supply hole 16 to 1.2-1.8 mm, the diameters of the middle negative pressure channel 15 and the edge negative pressure channels 17 to 0.8-1.0 mm, the diameter of each suction hole 11 to 0.1-0.2 mm, the depth of each suction hole 11 to 1.0-1.5 mm, the pitch between adjacent suction holes 11 to 0.5-0.7 mm, and the widths of the middle protrusion part 13 and the edge protrusion parts 14 to 0.3-0.5 mm. Such dimensions are suitable to hold the semiconductor element 3 that is approximately formed in the shape of a rectangle whose sides have lengths greater than 1.8 mm.

After the semiconductor element 3 is separated from the wafer on the fixing sheet 5 by the cutter, the semiconductor element 3 is held by the semiconductor element holding apparatus 1 in the following manner. In order to hold the semiconductor element 3 by the semiconductor element holding apparatus 1 having the collet 2 constructed as described above, as shown in FIG. 1, the upper ends of the lifting needles 6 are brought into contact with the lower surface of the semiconductor element 3, the lifting needles 6 are moved up through the fixing sheet 5 to separate the semiconductor element 3 from the adhesive agent applied to the fixing sheet 5, the semiconductor element-holding surface 12 of the collet 2 of the semiconductor element holding apparatus 1 is brought into contact with the surface 4 of the semiconductor element 3, and the negative pressure is supplied into the negative pressure supply hole 16 and then into the respective suction holes 11 through the middle negative pressure channel 15 and the edge negative pressure channels 17. The suction holes 11 are opened in the semiconductor element-holding surface 12 so that the negative pressure generates a suction force, by which the middle part and the breadthwise edge parts of the surface 4 of the semiconductor element 3 are suctioned.

The semiconductor element 3 held by the suction is individually conveyed to a chip tray, a lead frame or a board by the lifting mechanism and/or the X-Y moving mechanism of the semiconductor element holding apparatus 1, and then the negative pressure is, released. As a result, the semiconductor element 3 is disposed on the chip tray, the lead frame or the board.

In the illustrated embodiment, the protrusion is disposed at the semiconductor element-facing surface of the collet, i.e., the semiconductor element-holding surface of the collet, and the suction holes formed in the protrusion are opened to the semiconductor element to form the holding surface at the protrusion. As a result, the holding surface of the protrusion of the collet can contact the surface of the semiconductor element to hold the semiconductor element, and the collet does not come into contact with an element collapse layer formed at the cut surface of the semiconductor element. Consequently, element collapse pieces are prevented from being produced, and therefore, cleanness of the semiconductor element is maintained during and after conveying the semiconductor element.

Also, the holding surface of the protrusion is processed by a mirror finishing process or coated with polytetrafluoroethylene. Consequently, when the holding surface of the protrusion of the collet 2 is brought into contact with the surface of the semiconductor element 3 to suction-hold the semiconductor element 3, the surface of the semiconductor element 3 is prevented from being damaged.

In addition, the protrusion is approximately formed in the shape of an "H," and the semiconductor element 3 is suctioned to the holding surface of the "H"-shaped protrusion. Consequently, the stability of the holding force applied to the semiconductor element 3 is improved, and accuracy of the holding position between the semiconductor element 3 and the collet 2 is ensured.

The collet 2 having the above-described "H"-shaped protrusion is suitable to hold a semiconductor element having flexible parts, such as a semiconductor element used in a semiconductor acceleration sensor, which will be described below with reference to FIG. 5 to FIG. 7.

Figure 5:
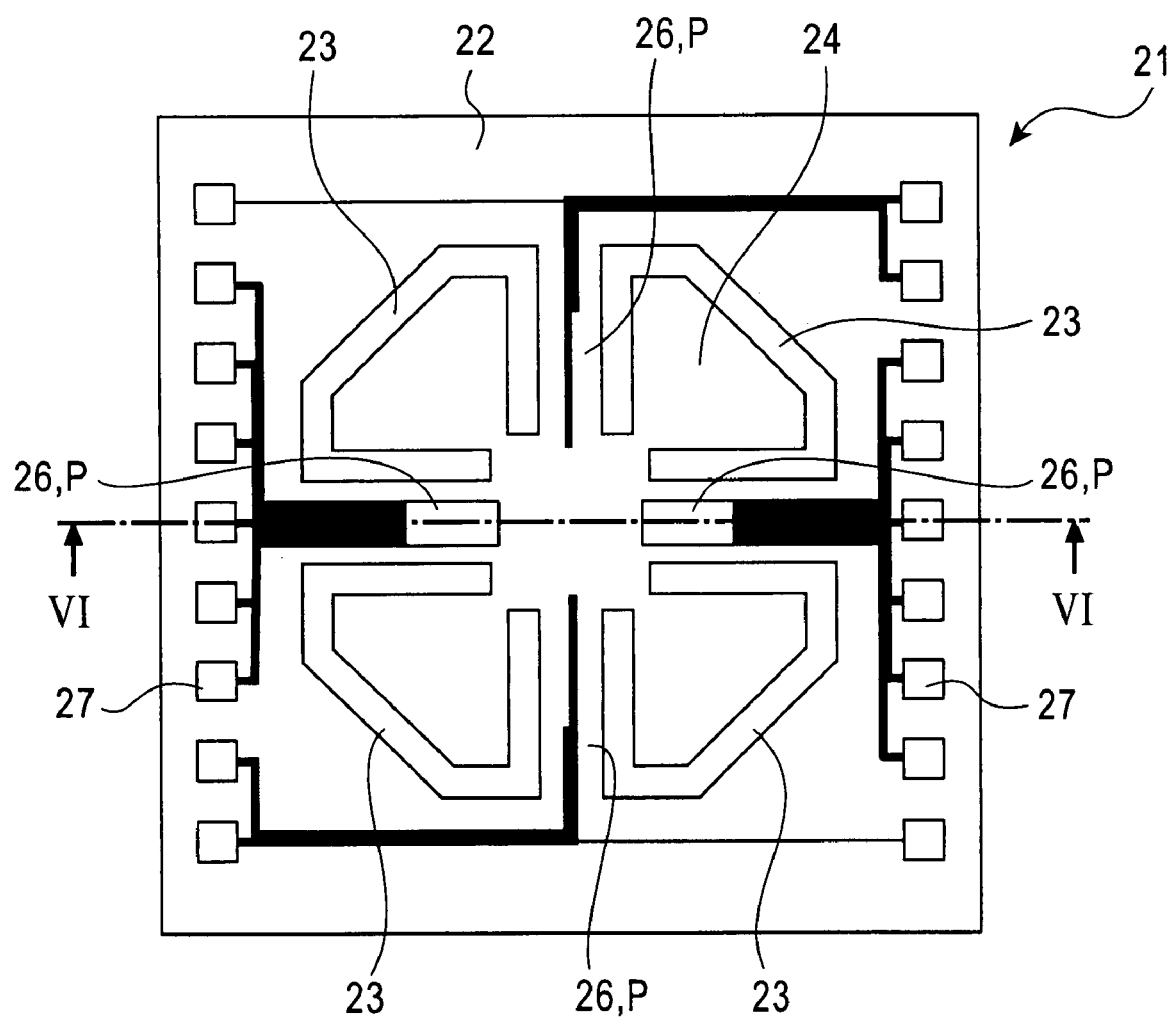
FIG. 5 is a plan view of a semiconductor element used in a semiconductor acceleration sensor.

FIG. 5 is a plan view showing a semiconductor element 21 used in a semiconductor acceleration sensor. This semiconductor element 21 has flexible parts 26. FIG. 6 is a sectional view taken along line VI-VI in FIG. 5. FIG. 7 illustrates the semiconductor element which is in a held state.

Figure 6:
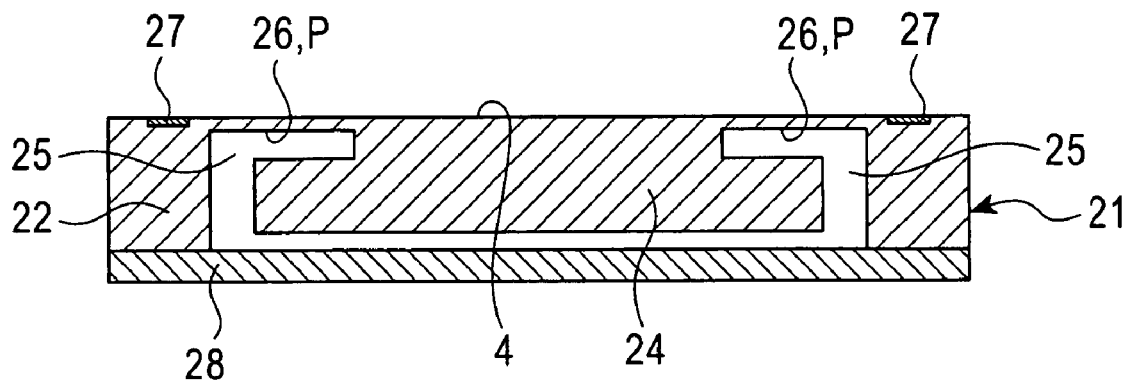
FIG. 6 is a cross-sectional view taken along line VI-VI of FIG. 5.

Referring to FIGS. 5 and 6, reference numeral 22 indicates a chip body of the semiconductor element 21, which is divided from a wafer. At the chip body 22 are formed weight parts 24, flexible parts 26, measuring elements P, and chip electrodes 27. The weight parts 24 are approximately cut off in the shape of a four-leafed clover by slits 23. The slits 23 are formed at the center area of the chip body 22 by an anisotropic etching process. The flexible parts 26 are defined by bore parts 25 formed in bridge parts between the adjacent weight parts 24. Each of the flexible parts 26 has a small thickness such that each flexible part 26 has flexibility. Bridge circuits of a piezoelectric resistance element are formed in the flexible parts 26 by adding and diffusing impurities in the flexible parts 26. The measuring elements P are provided for measuring displacement of the flexible parts 26 as acceleration through the use of the change of electric characteristics of the flexible parts 26. The chip electrodes 27 are internally connected to the measuring elements P.

Reference numeral 28 indicates a glass sheet, which is attached to the lower surface of the chip body 22 for restricting the amplitude of the flexible parts 26 due to the acceleration by a gap formed between the surface of the glass sheet 28 and the surface of the weight part 24. This prevents the flexible parts 26 from being damaged.

The semiconductor element 21 is divided from the wafer, which is fixed to the glass sheet 28. Consequently, the collet 2 suctions the semiconductor element 21 having the chip body 22 attached to the glass sheet 28 to hold the semiconductor element 21 as shown in FIG. 7.

Figure 7:
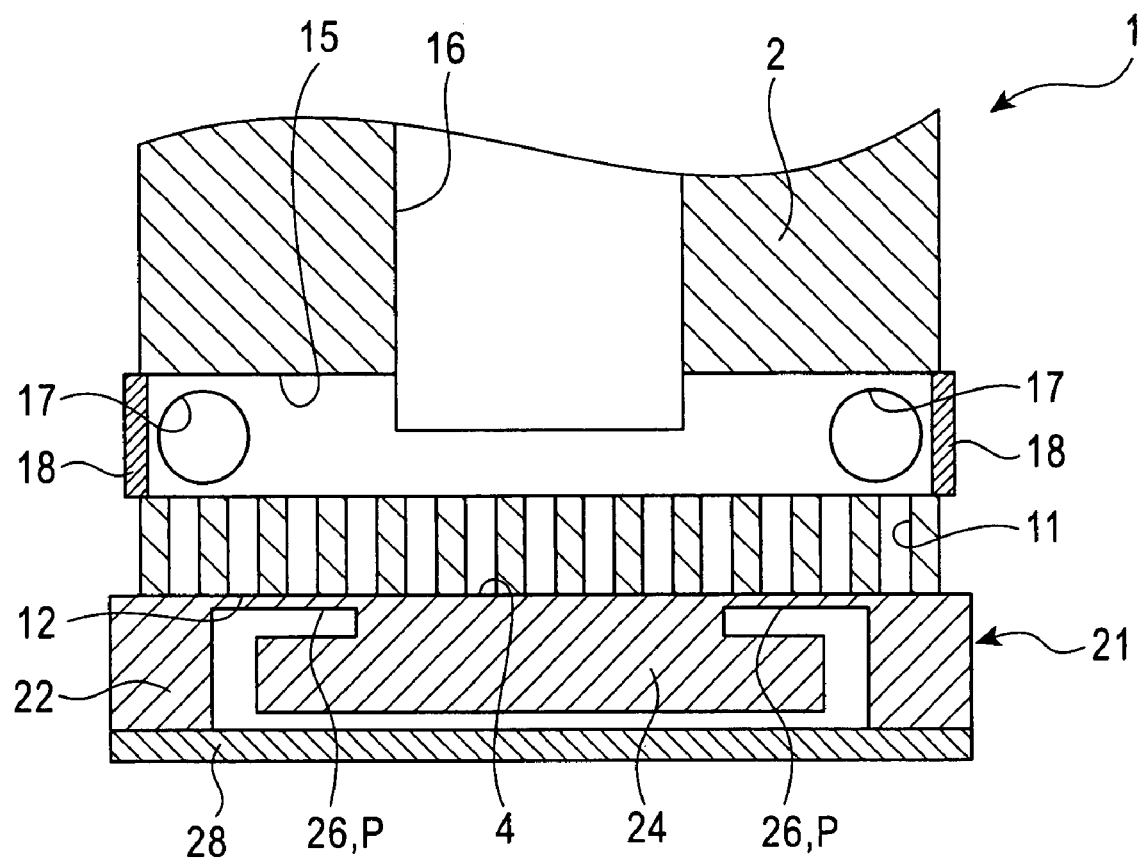
FIG. 7 is an enlarged view of a collet and a semiconductor element having flexible parts in a held state.

The semiconductor element 21 has the flexible parts 26 as shown in FIG. 7. However, the semiconductor element-holding surface 12 of the middle protrusion part 13 of the collet 2 is brought into contact with the surfaces of the flexible parts 26, and the surface 4 of the semiconductor element 21 is suctioned by the suction holes 11 whose diameter is relatively small. Consequently, the deformation of the flexible parts 26 is effectively prevented by the semiconductor element-holding surface 12 of the middle protrusion part 13 of the collet 2 when a suction force is applied to the flexible parts 26, and therefore, the flexible parts 26 are protected.

When holding the semiconductor element having the flexible parts, such as a semiconductor element used in a semiconductor acceleration sensor, the collet 2 having the "H"-shaped protrusion shown in FIG. 2 pneumatically holds the semiconductor element through the suction holes while protecting the flexible parts of the semiconductor element with the holding surface of the protrusion, and therefore, the flexible parts of the semiconductor element are prevented from damaged.

Embodiment 2

A second embodiment will be described with reference to FIG. 8 and FIG. 9.

Figure 8:
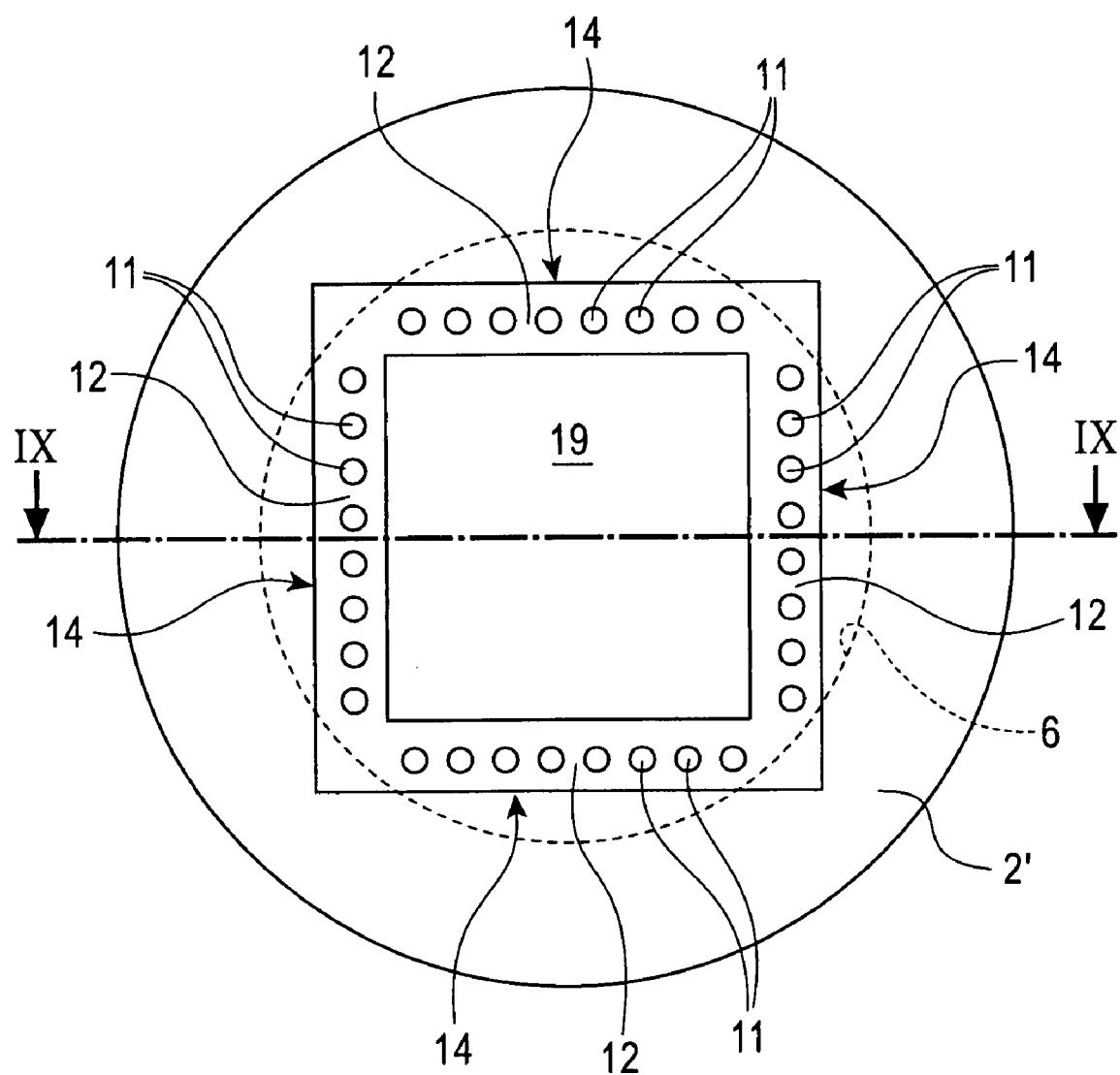
FIG. 8 is a bottom view showing a collet according to a second embodiment of the present invention.
Figure 9:
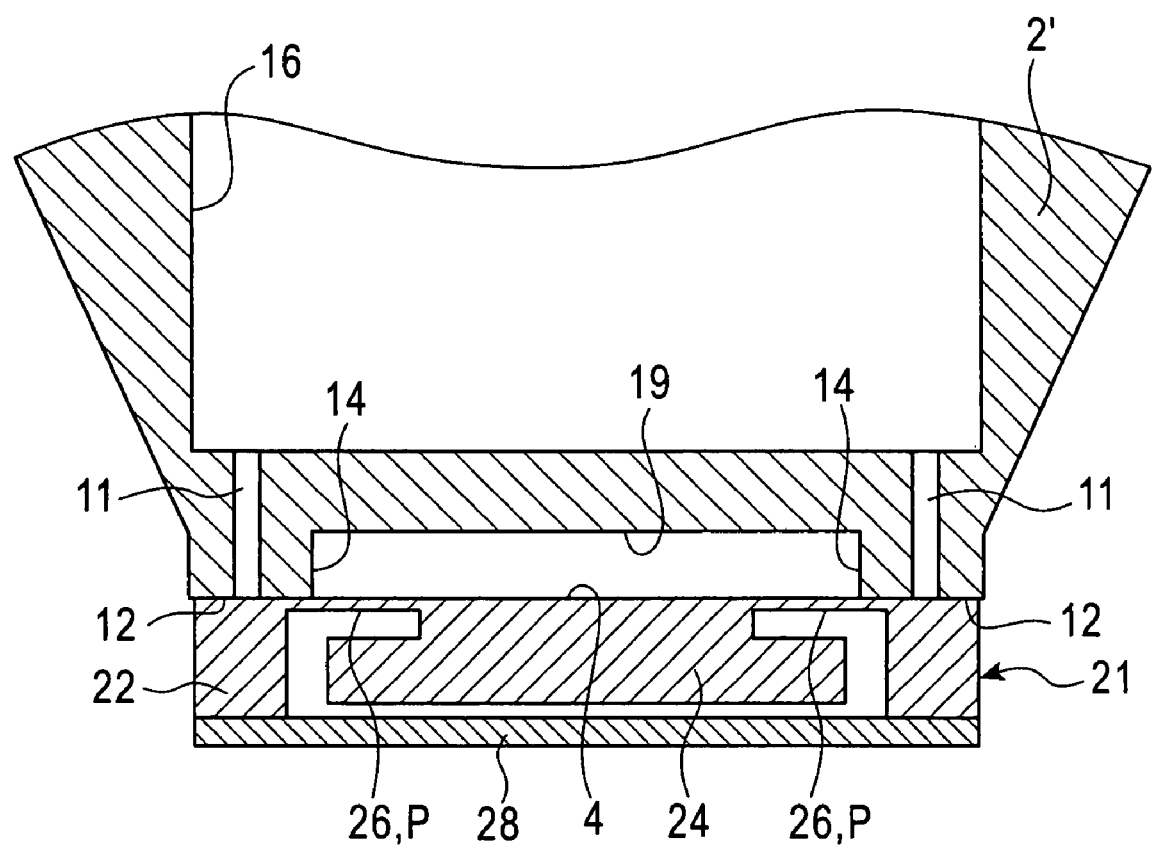
FIG. 9 illustrates a cross-sectional view taken along line IX-IX of FIG. 8.

FIG. 8 is a bottom view showing a collet 2' according to a second embodiment of the present invention, and FIG. 9 is a sectional view taken along line IX-IX of FIG. 8. Similar components of the semiconductor element holding apparatus in the first and second embodiments are assigned similar reference numerals and symbols, and a detailed description thereof will not be given below.

A semiconductor element used in the description of the semiconductor element holding apparatus according to the second embodiment is the semiconductor element 21 having the flexible parts 26, as described in connection with FIG. 5 to FIG. 7.

As shown in FIGS. 8 and 9, the collet 2' has a turned truncated cone shape whose diameter is gradually decreased toward the semiconductor element 21. At the rear surface 19 of a main body of the collet 2' is formed a frame-shaped protrusion having four edge protrusion parts 14, which correspond to four edges of the semiconductor element 21, respectively.

At each of the edge protrusion parts 14 are formed a plurality of suction holes 11, which are opened to the semiconductor element-holding surface 12. The suction holes 11 directly communicate with the negative pressure supply hole 16. The semiconductor element-holding surface 12 is processed by a mirror finishing process or coated with polytetrafluoroethylene.

In the second embodiment, the size S, which is the height of the protrusion, is set to 0.05-0.3 mm, the diameter of the negative pressure supply hole 16 to 1.2-1.8 mm, the diameter of each suction hole 11 to 0.05-0.2 mm, the depth of each suction hole 11 to 1.0-1.5 mm, the pitch between adjacent suction holes 11 to 0.5-0.7 mm, and the widths of the four edge protrusion parts 14 to 0.3-0.5 mm. The widths of the four edge protrusion parts 14 are determined such that the areas of the semiconductor element 21 having widths of 0.3 to 0.5 mm from the end surfaces of the semiconductor element 21 are suctioned. These dimensions are suitable to hold the semiconductor element 21 that is approximately formed in the shape of a square whose sides have lengths less than 1.8 mm.

In order to suction and convey the semiconductor element 21 by the semiconductor element holding apparatus 1 having the collet 2', the semiconductor element 21 is separated from the fixing sheet 5 by the lifting needles 6, the semiconductor element-holding surface 12 of the collet 2' of the semiconductor element holding apparatus 1 is brought into contact with the surface 4 of the semiconductor element 21, and the negative pressure supplied into the negative pressure supply hole 16 is supplied into the respective suction holes 11. The negative pressure generates a suction force, by which the four edges of the surface 4 of the semiconductor element 21 are suctioned. In this way, the semiconductor element 21 is held by the semiconductor element holding apparatus 1.

Center parts of the semiconductor element-holding surface 12 are brought into contact with the flexible parts 26 of the semiconductor element 21. However, the suction holes 11 to suction the surface 4 of the semiconductor element 21 are disposed outside the flexible parts 26. Consequently, the suction force is prevented from being applied to the flexible parts 26.

As shown in FIG. 9, the semiconductor element 21 held by the suction is individually conveyed to a chip tray, a lead frame or a board by the lifting and X-Y moving mechanisms of the semiconductor element holding apparatus 1, and then the negative pressure is released. As a result, the semiconductor element 21 is disposed on a desired location (the chip tray, the lead frame or the board).

The second embodiment can achieve the same advantages as the first embodiment, and can also achieve additional advantages. Specifically, the protrusion has a frame shape (or rectangular shape), and the holding surface of the protrusion is brought into contact with the surface of the semiconductor element to suction the semiconductor element in the second embodiment. Consequently, the stability of the holding force of the semiconductor element is improved, and positional errors are effectively prevented when the apparatus suctions the semiconductor element.

When the semiconductor element having the flexible parts is held, the surface of the semiconductor element outside the flexible parts is suctioned by the suction holes formed at the protrusion and the semiconductor element is held by the semiconductor element holding apparatus. Consequently, the flexible parts of the semiconductor element are more reliably prevented from being damaged.

It should be noted that the embodiments of the present invention have been disclosed for illustrative purposes. Those skilled in the art will appreciate that various changes, modifications, additions and substitutions are possible, without departing from the scope and spirit of the invention as disclosed in the accompanying claims.

This application is based on a Japanese Patent Application No. 2004-256391 filed on Sep. 3, 2004, and the entire disclosure thereof is incorporated herein by reference.

What is claimed is:

1. A method of manufacturing an acceleration sensor comprising:
   providing a collet which can apply a negative pressure, the collet having a protrusion extending from a main body of the collet such that the protrusion defines a chip-holding surface of the collet, and a plurality of suction holes being formed in the protrusion such that the plurality of suction holes are opened in the chip-holding surface;
   providing a wafer having a plurality of acceleration sensor chips;
   cutting an acceleration sensor chip from the wafer; and
   lifting the acceleration sensor chip which has been cut from the wafer, by using the collet which applies the negative pressure onto the acceleration sensor chip concerned,
   wherein the acceleration sensor chip includes a frame portion, a plurality of flexible arm portions extending inward from the frame portion and a weight portion supported by the plurality of flexible arm portions, and the collet applies the negative pressure to the frame portion, the plurality of flexible arm portions and/or weight portion.

2. The method as set forth in claim 1, wherein the protrusion includes a middle protrusion part disposed along a center line of the acceleration sensor chip, and edge protrusion parts disposed along edges of the acceleration sensor chip, the edge protrusion parts being connected to both ends of the middle protrusion part, respectively.

3. The method as set forth in claim 2, wherein the middle protrusion part applies the negative pressure onto the weight portion and at least one of the plurality of flexible arm portions of the acceleration sensor chip, and the edge protrusion parts apply the negative pressure onto the frame portion of the acceleration sensor chip.

4. A method of manufacturing an acceleration sensor comprising:
   providing a collet which can apply a negative pressure, the collet having a protrusion extending from a main body of the collet such that the protrusion defines a chip-holding surface of the collet, and a plurality of suction holes being formed in the protrusion such that the plurality of suction holes are opened in the chip-holding surface;
   providing a wafer having a plurality of acceleration sensor chips;
   cutting an acceleration sensor chip from the wafer; and
   lifting the acceleration sensor chip which has been cut from the wafer, by using the collet which applies the negative pressure onto the acceleration sensor chip concerned,
   wherein said providing a collet includes processing the chip-holding surface of the collet by a mirror finishing process.

5. The method as set forth in claim 4, wherein the acceleration sensor chip has a square or rectangular shape, and the protrusion includes four edge protrusion parts disposed along four edges of the acceleration sensor chip, respectively.

6. The method as set forth in claim 5, wherein the collet applies the negative pressure onto the four edges of the acceleration sensor chip.

7. The method as set forth in claim 2, wherein the edge protrusion parts are at right angles to the middle protrusion part.

8. A method of manufacturing an acceleration sensor comprising:
   providing a collet which can apply a negative pressure, the collet having a protrusion extending from a main body of the collet such that the protrusion defines a chip-holding surface of the collet, and a plurality of suction holes being formed in the protrusion such that the plurality of suction holes are opened in the chip-holding surface;
   providing a wafer having a plurality of acceleration sensor chips;
   cutting an acceleration sensor chip from the wafer; and
   lifting the acceleration sensor chip which has been cut from the wafer, by using the collet which applies the negative pressure onto the acceleration sensor chip concerned,
   wherein said providing a collet includes coating the chip-holding surface of the collet with polytetrafluoroethylene.

9. A method of manufacturing an acceleration sensor comprising:
   providing a collet which can apply a negative pressure, the collet having a protrusion extending from a main body of the collet such that the protrusion defines a chip-holding surface of the collet, and a plurality of suction holes being formed in the protrusion such that the plurality of suction holes are opened in the chip-holding surface;
   providing a wafer having a plurality of acceleration sensor chips;
   cutting an acceleration sensor chip from the wafer; and
   lifting the acceleration sensor chip which has been cut from the wafer, by using the collet which applies the negative pressure onto the acceleration sensor chip concerned, wherein the acceleration sensor chip includes a frame portion having four linear edges, four flexible arm portions extending inward from the four linear edges of the frame portion respectively, and a weight portion supported by the four flexible arm portions, and the protrusion includes four edge protrusion parts disposed linearly along the four linear edges of the frame portion, respectively, such that the collet applies the suction force only on the four linear edges of the frame portion.

10. The method as set forth in claim 9, wherein said providing a wafer includes making the four flexible arm portions thinner than the frame portion.

11. The method as set forth in claim 4, wherein the chip-holding surface of the collet extends along an outer periphery of the acceleration sensor chip.

12. The method as set forth in claim 4, wherein the protrusion includes three linear elements.

13. The method as set forth in claim 4, wherein the protrusion includes four linear elements.

14. The method as set forth in claim 8, wherein the chip-holding surface of the collet extends along an outer periphery of the acceleration sensor chip.

15. The method as set forth in claim 8, wherein the protrusion includes three linear elements.

16. The method as set forth in claim 8, wherein the protrusion includes four linear elements.

17. The method as set forth in claim 8, wherein the acceleration sensor chip has a square or rectangular shape, and the protrusion includes four edge protrusion parts disposed along four edges of the acceleration sensor chip, respectively.

18. The method as set forth in claim 17, wherein the collet applies the negative pressure onto the four edges of the acceleration sensor chip.

* * * * *